United States Patent
Chetlur et al.

(10) Patent No.: US 6,693,434 B2
(45) Date of Patent: Feb. 17, 2004

(54) AUTOMATED SYSTEM FOR ESTIMATING RING OSCILLATOR RELIABILITY AND TESTING AC RESPONSE AND METHOD OF OPERATION THEREOF

(75) Inventors: Sundar S. Chetlur, Singapore (SG); Pradip K. Roy, Orlando, FL (US); Johathan Z. Zhou, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 396 days.

(21) Appl. No.: 09/768,729

(22) Filed: Jan. 24, 2001

(65) Prior Publication Data

US 2001/0027547 A1 Oct. 4, 2001

Related U.S. Application Data

(60) Provisional application No. 60/182,966, filed on Feb. 16, 2000.

(51) Int. Cl.[7] ............... G01R 31/3163; G01R 31/30; G01R 31/27
(52) U.S. Cl. ............ 324/520; 324/763; 324/765
(58) Field of Search ................. 324/520, 535, 324/763, 765; 331/57

(56) References Cited

U.S. PATENT DOCUMENTS

| | | | | |
|---|---|---|---|---|
| 5,625,288 A | * | 4/1997 | Snyder et al. | 324/158.1 |
| 6,396,295 B1 | * | 5/2002 | Robinson et al. | 324/765 |
| 6,535,014 B2 | * | 3/2003 | Chetlur et al. | 324/765 |
| 6,567,773 B1 | * | 5/2003 | Rahmat et al. | 326/27 |
| 2003/0028687 A1 | * | 2/2003 | Goosen et al. | |

OTHER PUBLICATIONS

J. Winnerl et al., Ring Oscillator Structure for Realistic Dynamic Stress of MOSFETs and Interconnects, 1988 IEEE Procedings on Microelectronic Test Structures, vol. 1, No. 1, Feb. 1988, pp. 56–60.*
R. Merrill et al., A Technique for Characterizing AC Performance with a DC Parameter Tester, Proc. IEEE 1990 Int. Conference on Microelectronic Test Structures, vol. 3, Mar. 1990, pp. 229–231.*
Sencore, Inc., SC3100 "Auto Tracker", 2 pages, ©1997 Sencore, Inc., available at http://www.sencore.com/products/sc3100.htm.*

* cited by examiner

Primary Examiner—R. Stephen Dildine

(57) ABSTRACT

An automated system for, and method of estimating ring oscillator reliability and testing AC response of a device under test (DUT). In one embodiment, the system includes: (1) a DUT board that accepts, and allows electrical communication with, a plurality of DUTs, (2) a power source, couplable to the DUT board, that provides AC power of controllable characteristics to the plurality of DUTs and (3) an automated switching matrix, couplable between the DUT board and a circuit analyzer, that allows the circuit analyzer to analyze ring oscillators and predetermined portions of the plurality of DUTs at predetermined times as the power source provides the power thereto.

19 Claims, 3 Drawing Sheets

AUTOMATED SYSTEM FOR ESTIMATING RING OSCILLATOR RELIABILITY AND TESTING AC RESPONSE AND METHOD OF OPERATION THEREOF

CROSS-REFERENCE TO RELATED APPLICATION

This application is based on U.S. Provisional Application Ser. No. 60/182,966, filed Feb. 16, 2000, entitled "System and testers to automate measurements of ring oscillator (RO) and AC testers for circuit level reliability estimates," commonly assigned herewith and incorporated herein by reference.

TECHNICAL FIELD OF THE INVENTION

The present invention is directed, in general, to test apparatus and, more specifically, to an automated system for estimating ring oscillator (RO) reliability and testing AC circuit response and method of operating the same to test a sample of ROs and determine overall reliability based thereon.

BACKGROUND OF THE INVENTION

In the production of integrated circuits (ICs), considerable testing must be done to determine the IC parameters and whether the IC performs its intended function. In this regard, comprehensive testing regimens have been developed. The particular procedure used to carry out a test depends, of course, upon the type of IC being tested and the individual parameters of concern in a particular application. Nonetheless, tests commonly performed on ICs include determining circuit aging and alternating current (AC) testing of individual IC devices.

The procedures for determining circuit aging and for performing AC testing are well known in the art. Typically, analysis of a frequency of a ring oscillator associated with the IC is used to determine circuit aging. More specifically, a stress voltage, in addition to an operating voltage, is applied through the ring oscillator and across an IC device under test so that degradation in the ring oscillator frequency can be determined. Such degradation is measured and determined with a circuit analyzing device, such as an oscilloscope. Performing circuit aging testing by way of determining degradation in ring oscillator frequency is described in greater detail in Intl. Electron Device Meeting (IEDM), 1998, Short Course, San Francisco, Calif., Peng Fang, et al., which is incorporated herein by reference in its entirety.

For AC testing, operating and stress voltages are applied across the device under test so that the circuit analyzing device can be used to measure and determine the operating speed of that particular IC. Performing AC testing for determining operating speed of an IC is described in greater detail in Intl. Conf. on Microelectronic Test Structures (ICMTS), 2000, Monterey, Calif., S. Chetlur, et al., which is also incorporated herein by reference in its entirety, and more particularly on page 163 thereof. Those skilled in the pertinent art understand that determining the rate at which an IC ages, as well as its operating speed, are essential when manufacturing a product having IC devices included therein.

Performing these tests on semiconductor devices, such as ICs, at the singulated device level, i.e. prior to permanent mounting on an interconnection substrate, is typically conducted with an apparatus constructed on the "bed of nails" principle. Under this principle, the devices under test are usually ball-grid array or solder-bumped ICs with perimeter arrays or area arrays of contacts on one side of the device. The array of contacts is used, after successful test, to, for example, "flip-chip" bond the device to an interconnection substrate.

The apparatus for conducting these tests typically has a large x-y array of contact pins that are brought into contact with the predetermined portions of the device under test. Specifically, the pins in the x-y array of the test apparatus that align with the pads or bumps on the device are addressed with appropriate electrical circuitry in the test apparatus to apply test voltages (operating and stress voltages) to the device contacts and measure the electrical characteristics of the device with a circuit analyzer. Some testers are universal in the sense that pins in the x-y test array contact any given contact pattern so that different devices with different contact patterns can be tested by modifying the software used to address the array of test pins. However, testers can also be made with a permanent custom pin array tailored to a particular IC device design.

Although the mechanical constructs of testers used to determine IC aging and operating speed allows such testers to perform accurately, procedural aspects associated with performing such tests remain costly and time-consuming. For example, in conventional test procedures found in the prior art, intervention by a human operator is still required to gather the information needed to determine circuit aging and operating speed of the devices under test. Specifically, prior art testing systems require an operator to manually measure the degradation in ring oscillator frequency, as well as perform the AC testing, after a stress cycle of the device under test is completed. In addition, the operator is also required to begin the next stress cycle, and then return to take measurements again after the next stress cycle is complete.

Unfortunately, numerous disadvantages exist when operator intervention is required. First, the costs associated with staffing experienced operators in a testing facility can be quite large. Second, in some cases a stress cycle may end at an odd time, perhaps late in the evening, requiring the operator to be present at an unusual hour. Third, even beyond the need to work late hours, the accuracy of an operator's measurements at such late hours may also come into question. Finally, conventional tests for determining circuit aging and operating speed of IC devices usually last for two to three months at a time. Thus, devoting the resources of an operator over such a prolonged period of time may not be cost-effective when that operator's time may be better suited for other tasks.

Accordingly, what is needed in the art is a system for determining circuit aging of IC devices, as well as determining the operating speed of those devices, that does not suffer from the disadvantages found in prior art systems.

SUMMARY OF THE INVENTION

To address the above-discussed deficiencies of the prior art, the present invention provides an automated system for, and method of, estimating ring oscillator reliability and testing AC response of a device under test (DUT). In one embodiment, the system includes: (1) a DUT board that accepts, and allows electrical communication with, a plurality of DUTs, (2) a power source, couplable to the DUT board, that provides AC power of controllable characteristics to the plurality of DUTs and (3) an automated switching matrix, couplable between the DUT board and a circuit analyzer, that allows the circuit analyzer to analyze ring oscillators and predetermined portions of the plurality of DUTs at predetermined times as the power source provides the power thereto.

The present invention automates and significantly enhances the integrity of ring oscillator aging and AC response tests for devices such as those embodied in ICs.

In one embodiment of the present invention, the DUT board accepts eight of the DUTs. Of course, other numbers of DUTs per DUT board are within the broad scope of the present invention.

In one embodiment of the present invention, the automated switching matrix is a first automated switching matrix and the system further comprises a second automated switching matrix interposed between the first automated switching matrix and the circuit analyzer, the first and second automated switching matrices cooperating to allow the circuit analyzer to analyze the ring oscillators and the predetermined portions.

In one embodiment of the present invention, the circuit analyzer is an oscilloscope. Other circuit analyzers are, however, within the broad scope of the present invention.

In one embodiment of the present invention, the system further includes a chassis having a backplane bus that intercouples the DUT board, the switching matrix and the circuit analyzer. In a more specific embodiment, the system takes the form of a chassis that accepts DUT boards, switching matrices and the circuit analyzer as modules or boards therein.

In one embodiment of the present invention, the system further includes an environmental chamber for containing the DUT board and capable of subjecting the DUT board to a predetermined environment. The environmental chamber allows temperature and humidity, as well as any other desired physical, environmental attribute to be varied as desired to further testing.

In one embodiment of the present invention, the system further includes a network interface that allows the circuit analyzer to communicate via a computer network. The network interface, while not necessary to the present invention, advantageously allows testing to be initiated, terminated and monitored remotely.

The foregoing has outlined, rather broadly, preferred and alternative features of the present invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and specific embodiment as a basis for designing or modifying other structures for carrying out the same purposes of the present invention. Those skilled in the pertinent art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
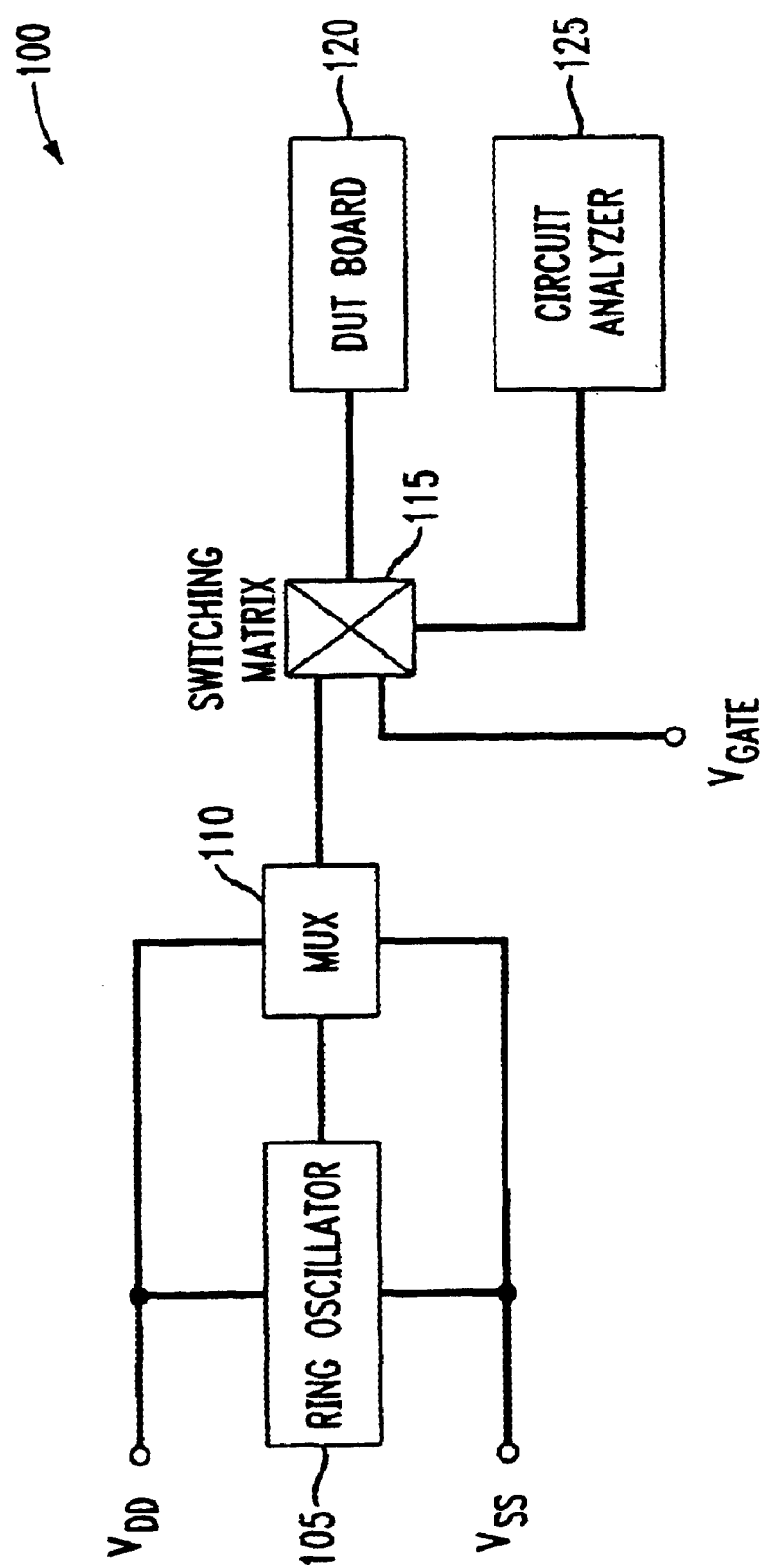
FIG. 1 illustrates an automated system for estimating ring oscillator reliability and testing AC response of a device under test (DUT) constructed according to the principles of the present invention.

Referring initially to FIG. 1, illustrated is an automated system 100 for estimating ring oscillator reliability and testing AC response of a device under test (DUT), such as an integrated circuit (IC), constructed according to the principles of the present invention. The system 100 includes a ring oscillator (RO) 105. Coupled to the output of the RO 105 is a multiplexing circuit (MUX) 110. Both the RO 105 and the MUX 110 are parallel-coupled to a power source (not illustrated) to receive a supply voltage $V_{DD}$ and a stressing voltage $V_{SS}$.

The system 100 further includes a switching matrix 115 coupled to the output of the MUX 110. The switching matrix 115 includes a gate activated by a gate voltage $V_{GATE}$. Coupled to the switching matrix 115 is a device under test (DUT) board 120. The DUT board 120 is employed to hold, and provide an electrical communication between, a plurality of DUTs (not individually illustrated). In the illustrated embodiment, the DUT board 120 accepts eight DUTs. Of course, other numbers of DUTs mounted on the DUT board 120 are well within the broad scope of the present invention.

Further coupled to the switching matrix 115 is a circuit analyzer 125. The circuit analyzer 125 assists in determining the circuit aging of the DUT by measuring the degradation of the RO 105 frequency when the stress voltage is applied to the DUT over a predetermined period of time. In addition, the circuit analyzer 125 performs AC testing on the DUT to determine the operating speed of the DUT, by analyzing predetermined portions found thereon. In the illustrated embodiment, the circuit analyzer 125 is an oscilloscope. Other circuit analyzers are, however, within the broad scope of the present invention.

The switching matrix 115 is coupled between the DUT board 120 and the circuit analyzer 125, and allows the circuit analyzer 125 to take measurements when necessary. As a result, the system 100 automates and significantly enhances the integrity of circuit aging testing, as well as AC response testing for devices such as those embodied in ICs. For further clarification, the function of the system 100 will now be described with continued reference to FIG. 1.

The supply voltage $V_{DD}$ provides normal operating power needed by the RO 105 and the DUTs held on the DUT board 120. To determine circuit aging, the power supply provides the stressing voltage $V_{SS}$, at periodic intervals, through the RO 105, the MUX 110 and the switching matrix 115, and then across the DUT board 120. Once the stressing voltage $V_{SS}$ dissipates, the RO frequency degradation during the current stress cycle is advantageously measured by the circuit analyzer 125. A computer or other type of controller (not illustrated) is responsible for operating the various components of the system 100, including the circuit analyzer 125 recording and analyzing the measurements.

To perform the actual testing, the switching matrix 115 is operated to allow the circuit analyzer 125 to become temporarily coupled to predetermined locations on the DUT board 120 to measure the degradation in the RO 105 frequency caused by the temporary influx of stress voltage $V_{SS}$. As discussed above, circuit aging of the DUTs can then be determined from this measurement. In addition to measuring the degradation of the RO 105 frequency, the circuit analyzer 125 also tests the AC response of the DUTs on the DUT board 120. Once the AC testing is performed on the DUTs, the individual operating speed of each DUT is determined.

After the necessary information for the current stress cycle has been gathered, the power supply terminates the stress voltage $V_{SS}$ being applied to the DUT board 120 through the RO 105. In addition, the switching matrix 115 decouples the circuit analyzer 125 from the DUT board 120. As a result, the DUTs on the DUT board 120 receive only operating voltage until the next stress cycle begins.

A significant advantage offered by the system 100 is the automation of the testing process provided by the switching matrix 115. As discussed above, systems found in the prior art for determining circuit agin and performing AC testing required manual intervention and analysis by a human operator. Specifically, the operator must be present when the current stress cycle ends in order to take the necessary measurements before the next stress cycle begins. Given that such tests customarily continue for two or three months, an automated system according to the present invention provides the necessary information, by a reliable means, with little or no intervention by, or time required of, a human operator. Those skilled in the pertinent art understand the advantages gained, not only of testing time, but also in personnel costs, of automating testing procedures and eliminating the need for human intervention.

Figure 2:
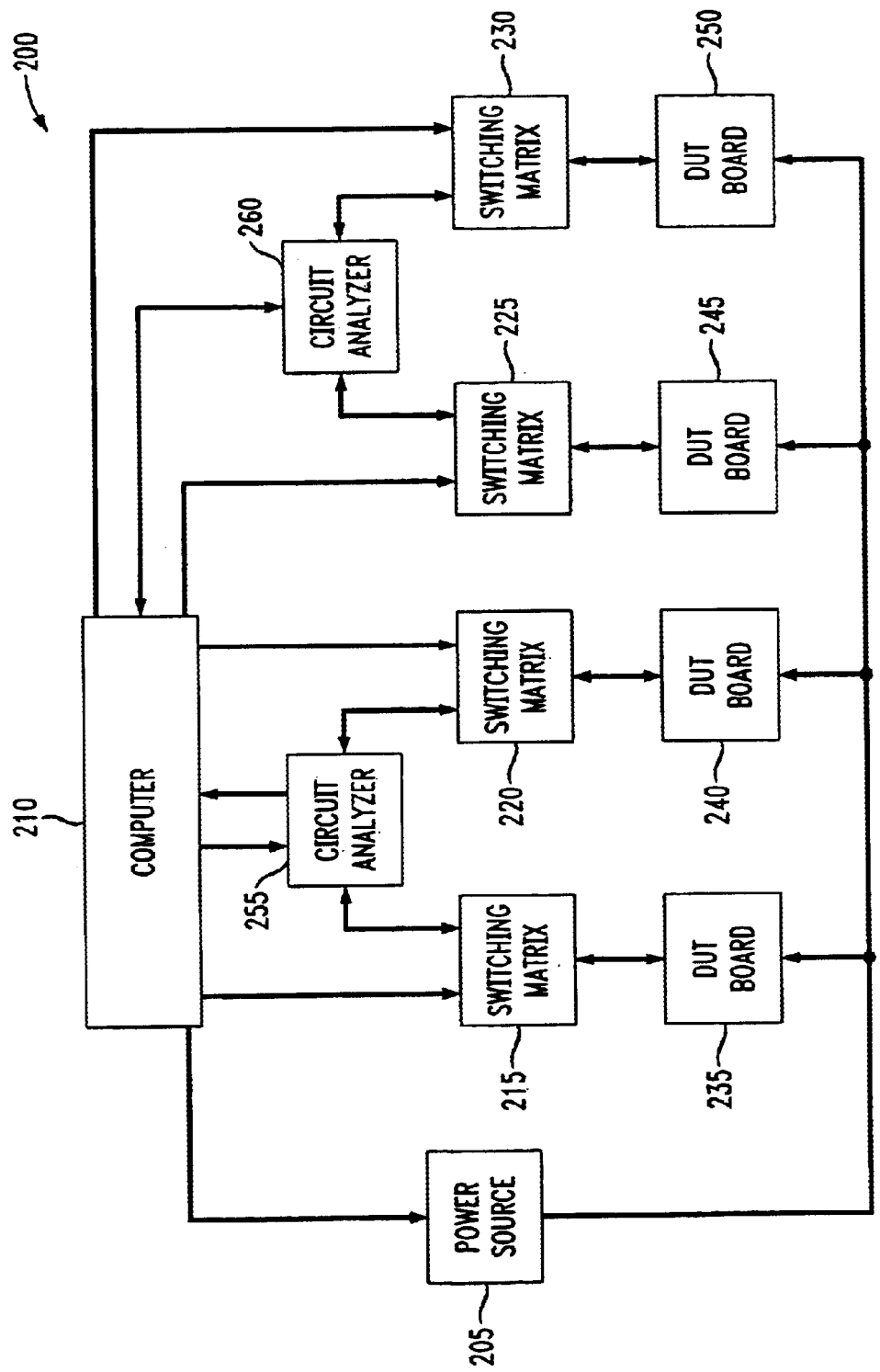
FIG. 2 illustrates a block diagram of another embodiment of an automated system constructed according to the present invention, having multiple circuit analyzers.

Turning now to FIG. 2, illustrated is a block diagram of another embodiment of an automated system 200 constructed according to the present invention, having multiple circuit analyzers. In the illustrated embodiment, the system 200 includes a power source 205 for providing stress and measurement voltages across DUTs, such as IC devices (not illustrated). The system 200 further includes a computer 210 for controlling the operation of the various components in the system 200.

The system 200 in FIG. 2 further includes first, second, third and fourth switching matrices 215, 220, 225, 230. Each of these switching matrices 215, 220, 225, 230 is coupled to the computer 210 for controlling their respective operations. The first, second, third and fourth switching matrices 215, 220, 225, 230 are also coupled to respective first, second, third and fourth DUT boards 235, 240, 245, 250. The DUT boards 235, 240, 245, 250, which hold the DUTs, are, in turn, coupled to the power source 205 to receive power therefrom.

The system 200 still further includes first and second circuit analyzers 255, 260. In the illustrated embodiment, the first and second circuit analyzers 255, 260 represent first and second oscilloscopes. However, in an alternative embodiment of the present invention, the first and second circuit analyzers 255, 260 may be illustrative of first and second channels in a single multi-channel oscilloscope. In either embodiment, the first circuit analyzer 255 is coupled to the first and second switching matrices 215, 220, and is interposed between the first and second switching matrices 215, 220 and the computer 210. Similarly, the second circuit analyzer 260 is coupled to the third and fourth switching matrices 225, 230. The second circuit analyzer 260 is also interposed between the third and fourth switching matrices 225, 230 and the computer 210.

The system 200 in FIG. 2 functions in an analogous manner to the system 100 in FIG. 1. However, because of the multiple circuit analyzers 255, 260, switching matrices 215, 220, 225, 230, and DUT boards 235, 240, 245, 250, the first and second switching matrices 215, 220 cooperate to allow the first circuit analyzer 255 to automatically analyze the first and second DUT boards 235, 240, respectively. Likewise, the third and fourth switching matrices 225, 230 cooperate to allow the second circuit analyzer 260 to automatically analyze the third and fourth DUT boards 245, 250, respectively. As a result, circuit aging and AC testing of the first and second DUT boards 235, 240 is measured and determined by the first circuit analyzer 255, while analogous testing of the third and fourth DUT boards 245, 250 is determined by the second circuit analyzer 260. In addition, by permitting data collection in parallel, either through separate oscilloscopes or separate channels within a single multi-channel oscilloscope, the automated system 200 illustrated in FIG. 2 even further improves measurement time above the manual systems of the prior art discussed above.

Figure 3:
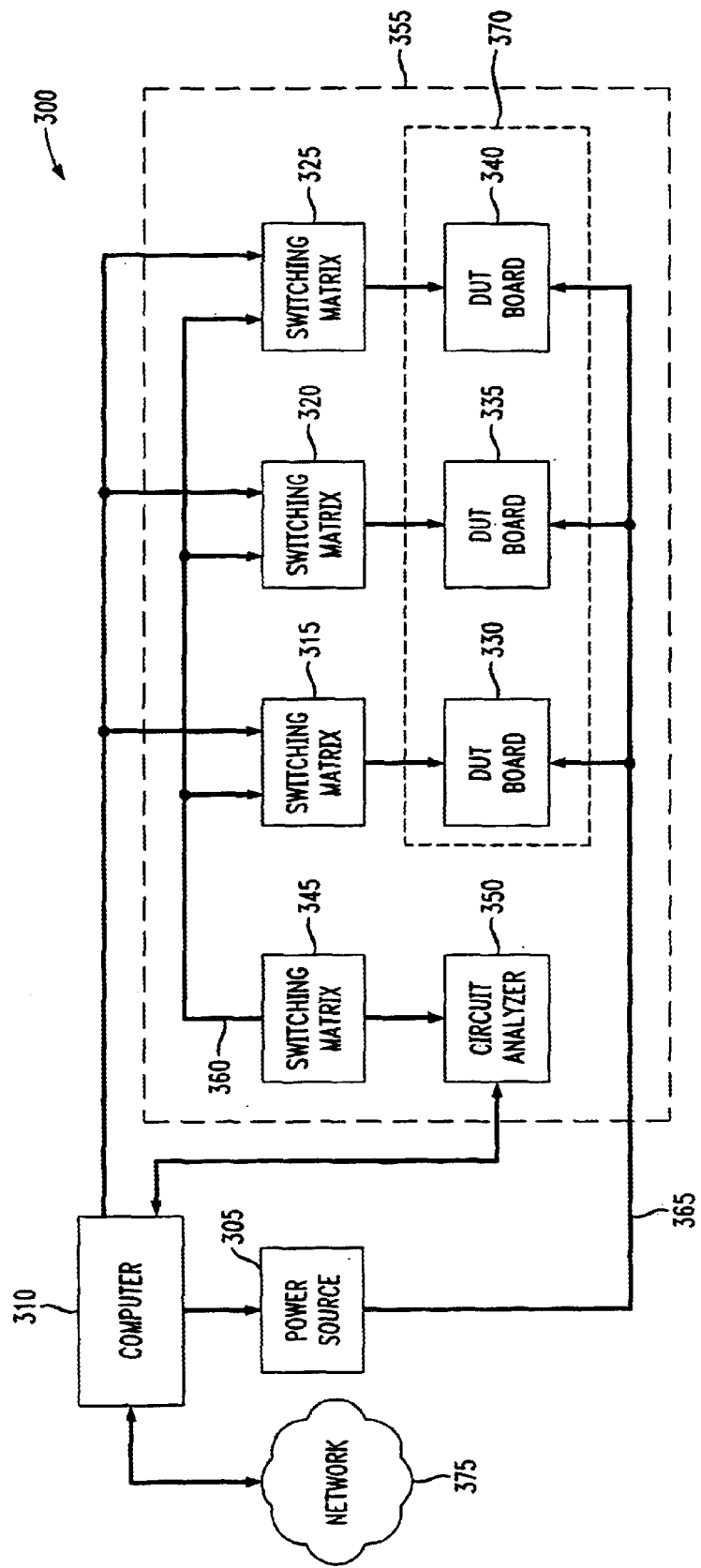
FIG. 3 illustrates a block diagram of yet another alternative embodiment of an automated system constructed according to the present invention.

Turning finally to FIG. 3, illustrated is a block diagram of yet another alternative embodiment of an automated system 300 constructed according to the present invention. The system 300, like the system 200, includes a power source 305 for providing stress and measurement voltages to the DUTs (not illustrated) Also illustrated in the system 300 is a computer 310 for controlling the operation of the various components in the system 300.

The system 300 further includes first, second and third switching matrices 315, 320, 325, as well as first, second and third DUT boards 330, 335, 340, each for holding multiple DUTs for testing. The system 300 still further includes a fourth switching matrix 345, as well as a circuit analyzer 350. The fourth switching matrix 345 is interposed between the first, second and third switching matrices 315, 320, 325 and the circuit analyzer 350. As a result, the first, second, third and fourth switching matrices 315, 320, 325, 345 cooperate to allow the circuit analyzer 350 to automatically analyze the degradation in RO frequency, as well as perform AC testing on predetermined portions of the DUTs. Moreover, FIG. 3 illustrates all of these components housed in a chassis 355.

The chassis 355 includes first and second backplane buses 360, 365 that intercouple the DUT boards 330, 335, 340, the switching matrices 315, 320, 325, 345 and the circuit analyzer 350. More specifically, the first, second and third switching matrices 315, 320, 325 are coupled to the fourth switching matrix 345, while the fourth switching matrix 345 is coupled to the circuit analyzer 350, via the first backplane bus 360. The first, second and third switching matrices 315, 320, 325 are also coupled to the first, second and third DUT boards 330, 335, 340, respectively. The first, second and third DUT boards 330, 335, 340 are, in turn, coupled to the power source 305 via the second backplane bus 365 to receive power therethrough. All the switching matrices 315, 320, 325, 345 are coupled to the computer 310 for controlling their respective operations.

In the illustrated embodiment, the chassis 355 accepts the DUT boards 330, 335, 340, the switching matrices 315, 320, 325, 345 and the circuit analyzer 350 as modules or boards therein. Such a modular mounting system for the chassis 355 permits quick removal and installation of varying components to further reduce the time required for testing. Of course, the present invention is not limited to any particular type of chassis, nor to any particular means of mounting the various components of the system 300 into the chassis 355. Moreover, the present invention is broad enough to encompass any means of mounting components in a chassis either now known or later developed.

In the illustrated embodiment of the present invention, the system 300 further includes an environmental chamber 370 for containing the DUT boards 330, 335, 340. The environmental chamber 370 is capable of subjecting the DUT boards 330, 335, 340 to predetermined environmental conditions. Specifically, the environmental chamber 370 allows temperature and humidity, as well as any other desired physical, environmental attribute to be varied as desired during the testing process in order to more accurately analyze the DUTs in a variety of environmental situations. Those skilled in the pertinent art understand that environmental conditions can affect DUTs, such as ICs, as well as the importance of determining those effects on a particular device.

The system 300 still further includes a computer network 375 coupled to a network interface (not illustrated) within the computer 310. The computer network interface in the computer 310 allows the circuit analyzer 350 to communicate via the computer 310 to the network 375. Communication through the network 375, while not necessary to the present invention, advantageously allows automated testing conducted according to the principles of the present invention to be initiated, terminated and monitored from a remote location.

The system 300 illustrated in FIG. 3 functions similarly to the system 100 of FIG. 1 and the system 200 of FIG. 2, as described above. Specifically, the first, second and third switching matrices 315, 320, 325 operate to allow the circuit analyzer 350 to automatically analyze the first, second and third DUT boards 330, 335, 340, respectively, to determine circuit aging and operating speed of the DUTs. However, because the fourth switching matrix 345 is interposed between the circuit analyzer 350 and the first, second and third switching matrices 315, 320, 325, automatic testing by the circuit analyzer 350 does not occur until the fourth switching matrix 345 is activated and cooperates with any one or more of the first, second or third switching matrices 315, 320, 325 to perform the tests. Once so cooperating, the circuit analyzer 350 is allowed to automatically analyze degradation in the RO frequencies as well as perform AC testing to determine the operating speed of the first, second and third DUT boards 330, 335, 340.

Although the present invention has been described in detail, those skilled in the pertinent art should understand that they can make various changes, substitutions and alterations herein without departing from the spirit and scope of the invention in its broadest form.

What is claimed is:

1. An automated system for estimating ring oscillator reliability and testing AC response of a device under test (DUT), comprising:
    a DUT board that accepts, and allows electrical communication with, a plurality of DUTs;
    a power source, couplable to said DUT board, that provides AC power of controllable characteristics to said plurality of DUTs; and
    an automated switching matrix, couplable between said DUT board and a circuit analyzer, that allows said circuit analyzer to analyze ring oscillators and predetermined portions of said plurality of DUTs at predetermined times as said power source provides said power thereto.

2. The system as recited in claim 1 wherein said DUT board accepts eight of said DUTs.

3. The system as recited in claim 1 wherein said automated switching matrix is a first automated switching matrix and said system further comprises a second automated switching matrix interposed between said first automated switching matrix and said circuit analyzer, said first and second automated switching matrices cooperating to allow said circuit analyzer to analyze said ring oscillators and said predetermined portions.

4. The system as recited in claim 1 wherein said circuit analyzer is an oscilloscope.

5. The system as recited in claim 1 further comprising a chassis having a backplane bus that intercouples said DUT board, said switching matrix and said circuit analyzer.

6. The system as recited in claim 1 further comprising an environmental chamber for containing said DUT board and capable of subjecting said DUT board to a predetermined environment.

7. The system as recited in claim 1 further comprising a network interface that allows said circuit analyzer to communicate via a computer network.

8. An automated method of estimating ring oscillator reliability and testing AC response of a device under test (DUT), comprising:
    placing a plurality of DUTs on a DUT board, said DUT board allowing electrical communication therewith;
    providing AC/DC power of controllable characteristics to said plurality of DUTs; and
    employing an automated switching matrix, couplable between said DUT board and a circuit analyzer, to allow said circuit analyzer to analyze ring oscillators and predetermined portions of said plurality of DUTs at predetermined times as said power source provides said power thereto.

9. The method as recited in claim 8 wherein said DUT board accepts eight of said DUTs.

10. The method as recited in claim 8 wherein said automated switching matrix is a first automated switching matrix and said method further comprises interposing a second automated switching matrix between said first automated switching matrix and said circuit analyzer to cause said first and second automated switching matrices to cooperate to allow said circuit analyzer to analyze said ring oscillators and said predetermined portions.

11. The method as recited in claim 8 wherein said circuit analyzer is an oscilloscope.

12. The method as recited in claim 8 wherein said method is carried out in a chassis having a backplane bus that intercouples said DUT board, said switching matrix and said circuit analyzer.

13. The method as recited in claim 8 further comprising subjecting said DUT board to a predetermined environment.

14. The method as recited in claim 8 further comprising communicating between said circuit analyzer and a computer network.

15. An automated system for estimating ring oscillator reliability and testing AC response of a device under test (DUT), comprising:
    a computer controller;
    a chassis having a backplane bus;
    DUT boards, located in said chassis and coupled to said backplane bus, that accept, and allow electrical communication with, a plurality of DUTs;
    a power source, couplable to said DUT boards, that provides AC/DC power of controllable characteristics to said plurality of DUTs;
    a circuit analyzer located in said chassis and coupled to said backplane bus; and
    automated switching matrices, couplable between each of said DUT boards and said circuit analyzer, that allow said circuit analyzer to analyze ring oscillators and predetermined portions of said plurality of DUTs at predetermined times as said power source provides said power thereto.

16. The system as recited in claim 15 wherein each of said DUT boards accepts eight of said DUTs.

17. The system as recited in claim 15 wherein said circuit analyzer is an oscilloscope.

18. The system as recited in claim 15 further comprising an environmental chamber for containing said chassis and capable of subjecting said DUT boards to a predetermined environment.

19. The system as recited in claim 15 further comprising a network interface, coupled to said computer controller, that allows said computer controller to communicate via a computer network.

* * * * *